United States Patent [19]
Kobayashi et al.

[11] Patent Number: 5,500,997
[45] Date of Patent: Mar. 26, 1996

[54] WORK MOUNTING APPARATUS

[75] Inventors: Kazutaka Kobayashi; Kineo Kojima; Takeshi Harada, all of Tokyo; Hiroshi Hohrai; Ikuo Hayafuji, both of Kuwana, all of Japan

[73] Assignees: Japan Tobacco Inc., Tokyo; Kabushiki Kaisha Toshiba, Kawasaki, both of Japan

[21] Appl. No.: 215,626

[22] Filed: Mar. 22, 1994

[30] Foreign Application Priority Data

Mar. 23, 1993 [JP] Japan .................................. 5-063740

[51] Int. Cl.⁶ .................................................. H05K 13/00
[52] U.S. Cl. ................................ 29/740; 29/759; 29/834
[58] Field of Search ........................... 29/740, 739, 741, 29/759, 834, 840

[56] References Cited

U.S. PATENT DOCUMENTS 4,768,698  9/1988  Brown et al. .
5,287,616  2/1994  Suzuki et al. ............................ 29/740

FOREIGN PATENT DOCUMENTS 0424641   5/1991  European Pat. Off. .
0449134  10/1991  European Pat. Off. .

Primary Examiner—Carl E. Hall
Attorney, Agent, or Firm—Oblon, Spivak, McClelland, Maier & Neustadt

[57] ABSTRACT

A work mounting apparatus has a head drum rotated in one direction, work heads arranged on the outer periphery of the drum, each work head including a suction nozzle projecting from the work head toward a circular travel path, for moving along the travel path while keeping a fixed orientation and repeating a cycloidal motion during rotation of the head drum, a work feeder arranged on the travel path, and a movable table arranged on the travel path at a distance from the work feeder, for receiving thereon a printed board, wherein the suction nozzle of each work head sucks up a work from the work feeder and releases the sucked work at a desired release position on the travel path. The movable table is moved along a line intersecting the travel path, whereby a target point on the printed board, at which the work is to be mounted, is brought to the release position on the travel path, in cooperation with cycle control of the cycloidal motion of the work head.

8 Claims, 6 Drawing Sheets

5,500,997

WORK MOUNTING APPARATUS

BACKGROUND OF THE INVENTION

1. Field of the Invention

This invention relates to a work mounting apparatus for mounting IC chips or like electronic components, as works, on printed boards.

2. Description of the Related Art

A work mounting apparatus of this type is disclosed in U.S. Pat. No. 5,234,304, for example. This conventional apparatus comprises a circular worktable, a head drum arranged above the worktable for continuous rotation and having pivots extending in a radial direction thereof, respectively and a plurality of work heads projecting from the outer periphery of the head drum. Each work head is capable of turning around the pivot of the head drum while maintaining a fixed orientation with respect to the worktable, and a suction nozzle projects from the outer peripheral surface of each work head toward the worktable. The worktable has a work supply section and a work mounting section, which are arranged below the path of movement of the work heads and separated from each other in the circumferential direction of the worktable. The work mounting section is supplied with printed boards.

The supply section of the worktable is provided with a number of work feeders disposed in radial form. The work feeders are capable of continuously supplying various electronic components, e.g., IC chips, resistors, capacitors, etc., as works, to respective supply positions on the worktable.

The work mounting section is provided with an XY table, on the upper surface of which are supplied the printed boards on which the works are to be mounted.

In the work mounting apparatus described above, as the work heads turn around their pivot during rotation of the head drum, the suction nozzle of each work head moves in the circumferential direction of the worktable, i.e., along the path of movement of the work heads, while making cycloidal motions. By appropriately setting the turning direction and speed of the work heads with respect to the circumferential speed of the head drum, the speed of the suction nozzle of each work head relative to the supply and mounting sections can be made zero at the time when the suction nozzle approaches closest to a supply position on the worktable and the printed board, that is, when the suction nozzle is at its lowest position. Consequently, even while the head drum is continuously rotated, the suction nozzle of each work head is able to reliably suck up a work on the supply position. The work retained by the suction nozzle moves, together with the work head, to the mounting section, and then is mounted to a printed board on the mounting section.

In order for the work to be accurately mounted at a target point on the printed board, it is necessary that the XY table move the printed board such that the target point on the printed board is set at the path of movement of the work heads, i.e., the path of movement of the suction nozzles, and also that the movement of the printed board be completed before the work retained by the suction nozzle of the work head reaches a position above the printed board.

To improve the efficiency of mounting works on the printed board, on the other hand, the rotational speed of the head drum, i.e., the moving speed of the work heads, need only be increased. In this case, however, a disadvantage arises in that sufficient time cannot be saved for the movement of printed board, and thus the work mounting efficiency is restricted by the capability of the XY table itself. More specifically, the suction nozzles of the work heads successively pass above the printed board on the mounting section; therefore, after one work head passes above the printed board the operation of the XY table must be completed before the next work head reaches the printed board. If the speed of revolution of the work heads is too fast, the operation of the XY table fails to follow the work head speed.

SUMMARY OF THE INVENTION

An object of this invention is to provide a work mounting apparatus capable of efficiently moving a printed board placed on a work mounting section and quickly bringing a desired point on the printed board to a path of movement of work heads, thereby further improving the work mounting efficiency.

The above object is achieved by a work mounting apparatus according to this invention, which comprises: a work supply section having a supply position to which works are continuously supplied, the supply position being located on a predetermined travel path; pickup means for picking up a work from the supply position, the pickup means including a carrier arranged above the travel path and movable along the travel path, and a work head arranged at the carrier and having an attraction rod projecting toward the travel path, and the pickup means causing the work head to make a cycloidal motion, while holding the work head in a fixed orientation with respect to the travel path during movement of the carrier, and permitting a change of cycle of the cycloidal motion, thereby causing the attraction rod of the work head to attract a work at the supply position and to release the attracted work at a desired release position on the travel path; and a work mounting section arranged on the travel path at a distance from the supply section, the work mounting section including a table surface for receiving thereon a component on which a work is to be mounted, and actuating means for moving the table surface along a line intersecting the travel path and shifting a target point on the component, at which the work is to be mounted, to the travel path.

As mentioned above, the attraction rod of the work head can release the attracted work at a desired release position on the travel path. Accordingly, the work can be mounted to a desired point on the component, by moving the table surface along the line and shifting the target point on the component to the travel path.

Thus, when the target point is brought to the travel path, the load on the actuating means is small. Consequently, the actuating means can quickly shift the target point on the component to the travel path, thus improving the work mounting efficiency.

An example of the actuating means is rotating means which rotates the table surface in a plane parallel to a plane containing the travel path. In this case, the table surface may have a center of rotation located on the travel path.

Another example of the actuating means is swing means which swings the table surface in a plane parallel to the plane containing the travel path. The swing means has a center of swinging motion located at a predetermined distance from the table surface.

Further, in addition to the aforementioned rotating means, the actuating means may further include reciprocating means for causing a linear motion of the table surface toward the travel path. In this case, the rotating means and the reciprocating means move the table surface in cooperation with or independently of each other.

BRIEF DESCRIPTION OF THE DRAWINGS

The present invention will become more fully understood from the detailed description given hereinbelow and the accompanying drawings which are given by way of illustration only, and thus, are not limitative of the present invention, and wherein.

DETAILED DESCRIPTION OF THE PREFERRED EMBODIMENTS

Figure 1:
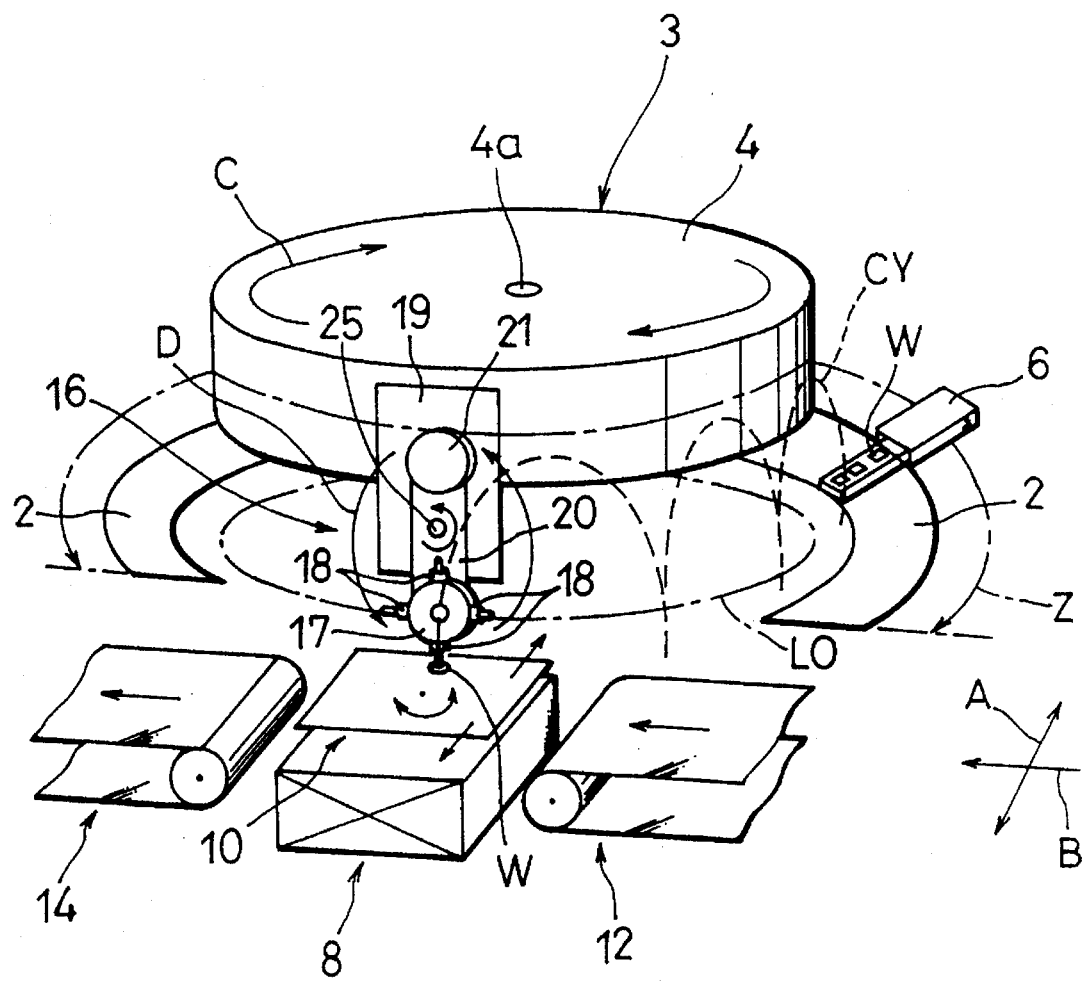
FIG. 1 is a perspective view schematically illustrating a work mounting apparatus.

A work mounting apparatus shown in FIG. 1 is generally composed of a ring-shaped worktable 2, and a rotary drum device 3 arranged in the center of and above the worktable 2. The rotary drum device 3 has a head drum 4 rotatable in a horizontal plane.

Figure 2:
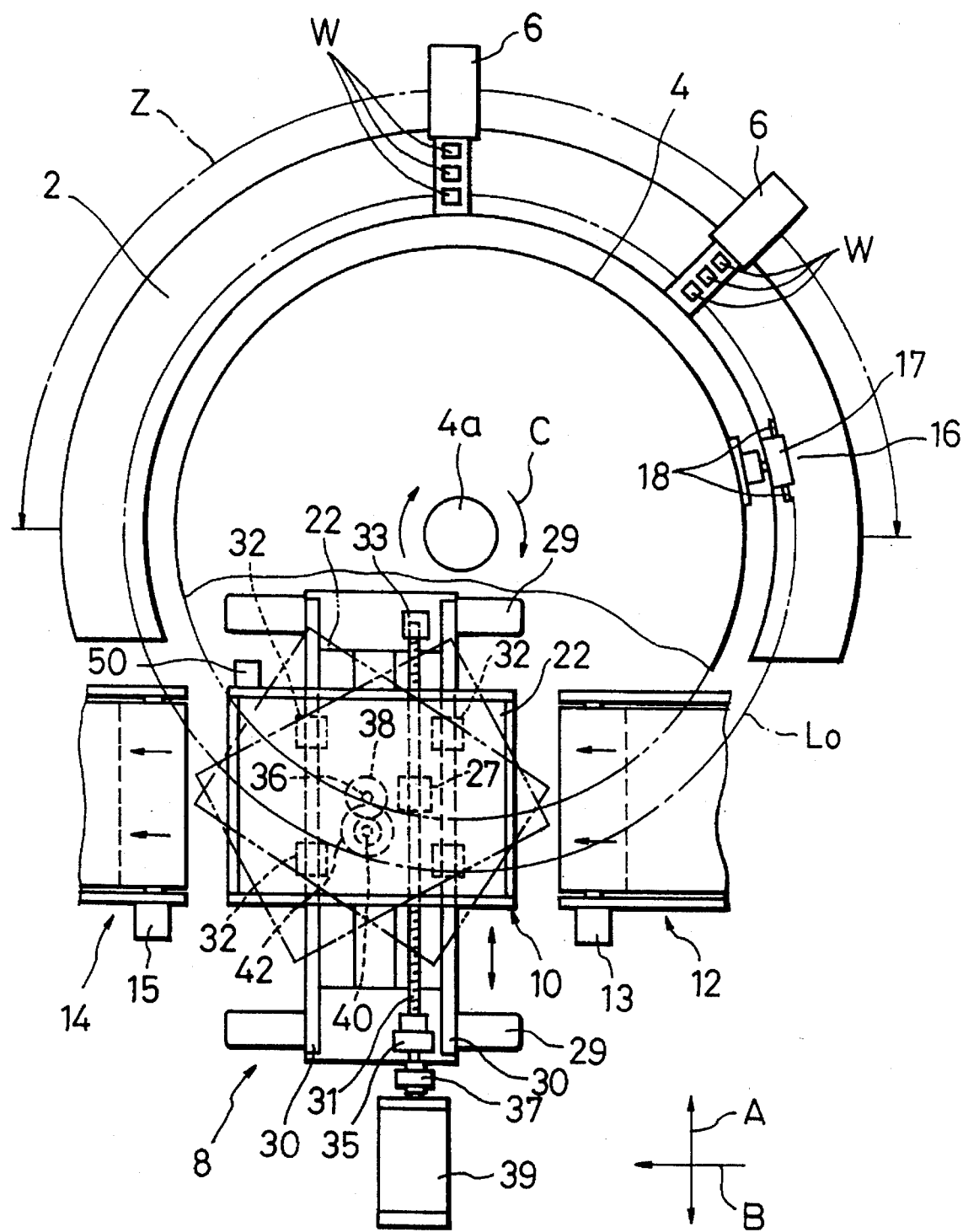
FIG. 2 is a plan view of the work mounting apparatus.

As clearly shown in FIG. 2, a number of work feeders 6 are disposed on the worktable 2 in radial form, for continuously supplying various electronic components, e.g., IC chips, resistors, capacitors, etc., as works, to respective supply positions on the worktable 2.

Each work feeder 6 is separated from an adjacent one at a predetermined distance in the circumferential direction of the worktable 2. FIG. 2 illustrates only two of the work feeders 6, i.e., only two work supply sections.

Figure 3:
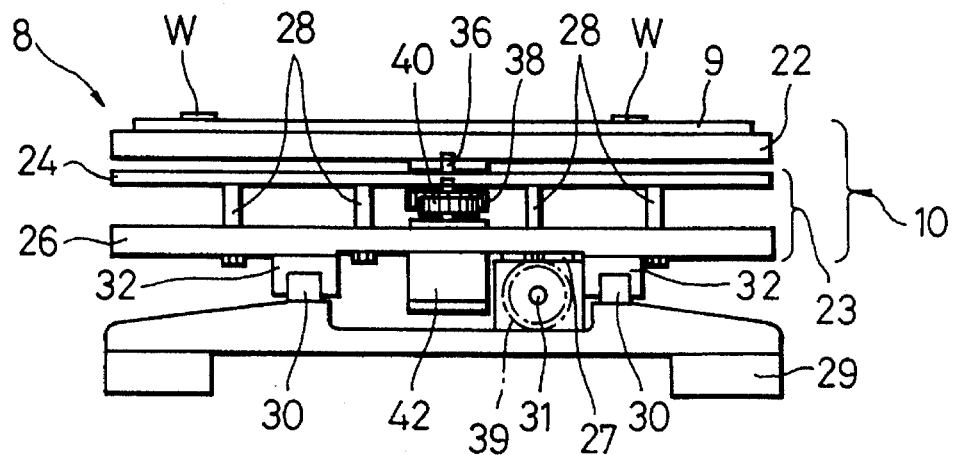
FIG. 3 is a front view illustrating a mounting section of the apparatus shown in FIG. 1.

As is clear from FIG. 2, part of the worktable 2 is cut away, and a work mounting section is arranged at this cut portion. More specifically, the mounting section comprises a table device 8 having a movable table 10. The movable table 10 includes a rotary table 22 and a slide table 23, as shown in FIG. 3. The rotary table 22 is mounted on the upper surface of the slide table 23, and has an upper surface for receiving a printed board 9 thereon.

The rotary table 22 and the slide table 23 will be now described in detail. As shown in FIG. 3, the slide table 23 has upper and lower plates 24 and 26. The upper and lower plates 24 and 26 extend parallel to each other with a space therebetween, and are coupled together with a plurality of spacers 28 interposed therebetween.

Under the lower plate 26 of the slide table 23 are arranged a pair of guide rails 30, which extend parallel with each other in a diametrical direction of the head drum 4. Namely, each of the guide rails 30 extends in the direction of arrow A in FIG. 2, and opposite ends thereof are supported on a pair of bases 29, respectively.

The lower plate 26 is supported on the guide rails 30 by means of a plurality of legs 32. Two legs 32 are provided for each of the guide rails 30 and are secured to the lower surface of the lower plate 26. Each leg 32 has a guide groove cut in a lower surface thereof. Thus, the legs 32 are each slidably fitted on the corresponding guide rail 30 at the guide groove.

Further mounted to the lower surface of the lower plate 26 is a bracket 27 having a screw hole. A feed screw 31 penetrates through the screw hole of the bracket 27 in engagement therewith, and extends between the bases 29 in parallel with the guide rails 30. The feed screw 31 has one end rotatably supported by one of the bases 29 via an end bearing 33, and has the other end rotatably supported by the other base 29 via a bearing 35. The other end of the feed screw 31 projects from the bearing 35, and the projected end is coupled to the motor shaft of a first servomotor 39 through a coupling 37. The first servomotor 39 is electrically connected to a controller (not shown), and rotation thereof is controlled by the controller. Thus, as the feed screw 31 rotates due to operation of the first servomotor 39, the slide table 23 moves in one of the directions indicated by arrow A in FIG. 2, while being guided by the guide rails 30.

Referring again to FIG. 3, the rotary table 22 is arranged above the upper plate 24 of the slide table 23 and is rotatably supported on the central part of the slide table 23. More specifically, the rotary table 22 has a rotary shaft 36 projecting from the lower surface thereof. The shaft 36 of the rotary table 22 vertically extends between the upper and lower plates 24 and 26 of the slide table 23 and are rotatably supported by these plates. A first gear 38 is mounted on a portion of the rotary shaft 36 located between the upper and lower plates 24 and 26. The first gear 38 is in mesh with a second gear 40, which in turn is coupled to the motor shaft of a second servomotor 42. The second servomotor 42 is mounted to the lower plate 26 of the slide table 23 with the motor shaft thereof directed in the vertical direction. The second servomotor 42 also is electrically connected to the aforementioned controller, and thus the controller controls not only the rotation of the first servomotor 39 but also the rotation of the second servomotor 42.

As the second servomotor 42 operates, the rotary shaft 36 is rotated by means of the first and second gears 38 and 40, whereby the rotary table 22 is allowed to rotate about the rotary shaft 36 over a predetermined angular range. Accordingly, the movable table 10 makes a composite movement which is the composition of the linear motion of the slide table 23 and the rotary motion of the rotary table 22.

Further, the upper surface of the rotary table 22 is formed by an endless movable belt, which is driven by an electric motor 50 so as to move in the direction indicated by arrow B in FIG. 2.

On opposite sides of the table device 8 are arranged an inlet conveyor 12 and an outlet conveyor 14, as shown in FIG. 2. The inlet conveyor 12 is arranged in the inlet side of the rotary table 22, as viewed in the traveling direction of the belt of the table 22, and located close to the table 22. The outlet conveyor 14 is arranged at the outlet side of the rotary table 22 and located close thereto. The inlet and outlet conveyors 12 and 14 include respective endless conveyor belts, which are driven by electric motors 13 and 15, respectively, so as to travel in the direction of arrow B in FIG. 2. The electric motors 13 and 15 are electrically connected to the aforementioned controller. The inlet conveyor 12 transports printed boards 9, on which the aforesaid works are to be mounted, toward the rotary table 22, which then receives each printed board on the upper surface thereof. The outlet conveyor 14, on the other hand, receives the printed board from the rotary table 22 and carries the received printed board.

More specifically, the rotary table 22 of the table device 8 is first aligned with the conveyor belts of the inlet and outlet conveyors 12 and 14. In this case, the operation of the first servomotor 39 of the rotary table 22 and the operation of the second servomotor 42 of the slide table 23 are controlled by the controller.

Consequently, as the belts of the rotary table 22 and inlet conveyor 12, aligned with each other, travel in the direction B, the printed boards 9 on the inlet conveyor 12 are successively fed onto the rotary table 22.

Similarly, as the belts of the rotary table 22 and outlet conveyor 14, aligned with each other, travel in the direction B, the printed board 9 on the rotary table 22, on which works have been mounted, is discharged to the outlet conveyor 14.

During the above loading and unloading of printed boards, the electric motors 50, 13 and 15 are controlled by the controller.

Each work supply position of the worktable 2 is set to be on a level with the printed board on the rotary table 22. In FIG. 2, Z indicates a region in which the work feeders 6 can be arranged.

The head drum 4 of the aforementioned rotary drum device 3 has a drum shaft 4a, as shown in FIG. 1, and the drum shaft 4a has a lower end rotatably supported by a base (not shown). This base is arranged inside the worktable 2 in the center thereof. The drum shaft 4a is coupled to a drive motor, not shown, which motor is capable of rotating the head drum 4 in the direction of arrow C in FIG. 1 at a fixed circumferential speed.

A plurality of head units 16 is arranged on the outer periphery of the head drum 4 at an equal distance in the circumferential direction. These head units 16 are mounted at similar positions with respect to the head drum 4 and have an identical structure, though only schematically illustrated in FIGS. 1 and 4. Accordingly, only one of the head units, i.e., the head unit 16, will be described below.

Figure 4:
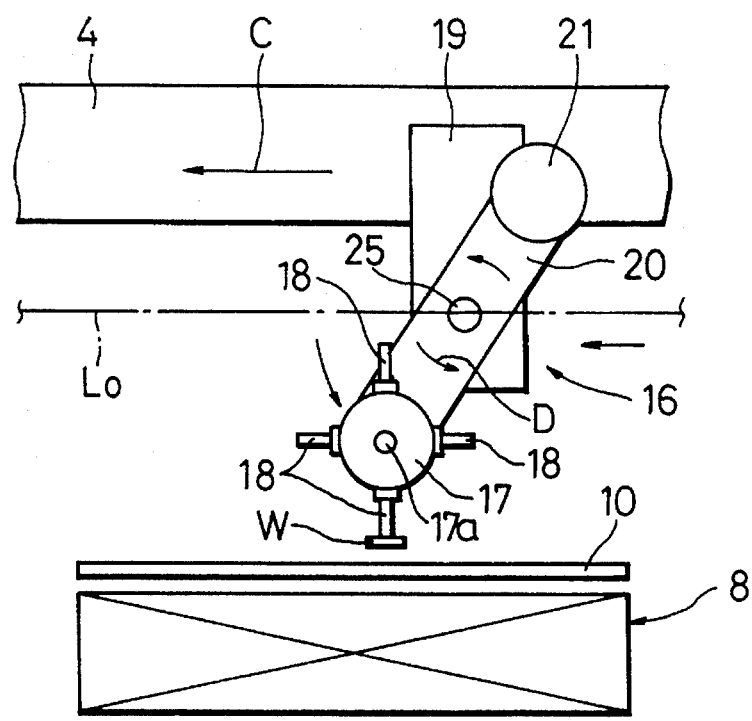
FIG. 4 is a front view illustrating a head unit of the apparatus shown in FIG. 1.
Figure 5:
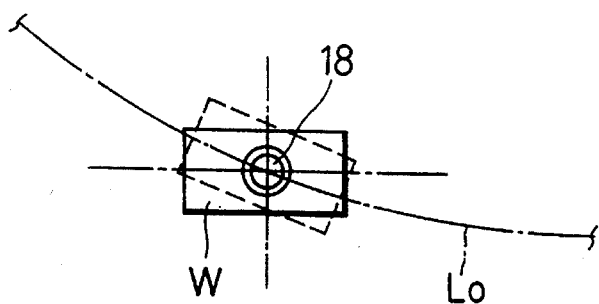
FIG. 5 is a view of a work sucked up by a suction nozzle shown in FIG. 4.

As shown in FIG. 4, the head unit 16 has a circular work head 17. Four suction nozzles 18 project from the outer periphery of the work head 17 at an equal distance in the circumferential direction. Each of the suction nozzles 18 has a suction port (not shown) opening at a distal end thereof. Among the suction nozzles 18, that directed downward, i.e., the work nozzle 18, is supplied with a suction pressure and a blow pressure at the suction port thereof. Thus, when supplied with the suction pressure at the suction port, the work nozzle 18 sucks up a work W and retains the same by suction. Conversely, when supplied with the blow pressure at the suction port, the work nozzle 18 releases the work W. Further, as shown in FIG. 5, each suction nozzle 18 is rotatable on an axis thereof, whereby the orientation of the sucked work W can be corrected through rotation of the work nozzle 18.

The work head 17 is rotatably supported on one end of a link arm 20. A balance weight 21 is attached to the other end of the link arm 20 and has a weight substantially equal to that of the work head 17. A middle portion of the link arm 20 is coupled to a turning device 19 arranged on the side of the head drum, via a pivot 25. Note, here, that the pivot 25 extends in the radial direction of the head drum 4. Although not illustrated in detail, the turning device 19 controls the rotation of the link arm 20, i.e., the turning motion of the work head 17 around the pivot 25, and also has a function of keeping the work head 17 in a fixed orientation during the turning motion. Specifically, the turning device 19 includes a planetary gear belt drive coupling the pivot 25 to a head shaft 17a of the work head 17, and this planetary gear belt drive serves to hold the work head 17 in the fixed orientation during the turning motion thereof. Accordingly, during the turning motion of the work head 17, the work nozzle 18 of the work head 17 is directed downward at all times. The turning device 19 also is controlled by the controller.

The structure of the turning device 19 is described in detail in U.S. Pat. No. 5,234,304 mentioned above.

Figure 6:
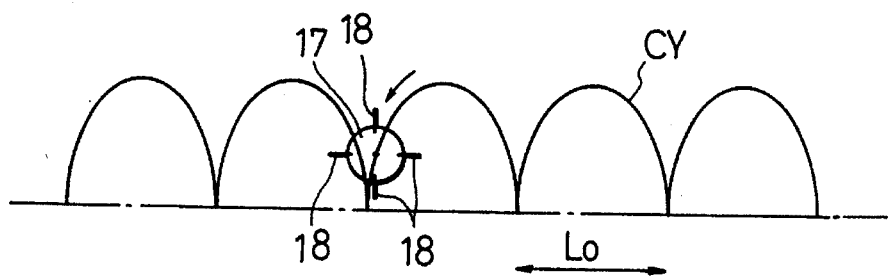
FIG. 6 is a diagram illustrating a locus of cycloidal motions observed when the work head shown in FIG. 4 makes a cycloidal motion at a predetermined cycle.

The turning direction of the work head 17 is indicated by arrow D in FIG. 4. Namely, in cases where the head drum 4 is rotated in the direction of arrow C, the turning direction of the work head 17 is set such that the direction of downward movement of the work head 17 is opposite to the direction of rotation of the head drum 4. Since the rotation of the head drum 4 and the turning motion of the work head 17 are combined, the work head 17 repeatedly makes a motion shown in FIG. 6. As a result, the distal end of the work nozzle 18 of the work head 17 repeatedly moves toward and away from the worktable 2, that is, it repeats an up-and-down motion, along a cycloid curve CY as the head drum 4 rotates.

If the circumferential speed of the head drum 4, i.e., the speed of revolution of the work head 17, is equal to the turning speed of the work head 17, or more strictly, the turning speed of the distal end of the work nozzle 18, then the moving speed of the work nozzle 18 relative to the worktable 2, i.e., the ground speed, becomes zero when the work nozzle 18 is located at its lowest position, and becomes maximum when the work nozzle 18 is located at its highest position. The cycle or period of the cycloidal motion of the work nozzle 18 is indicated by $L_0$ in FIG. 6.

Figure 7:
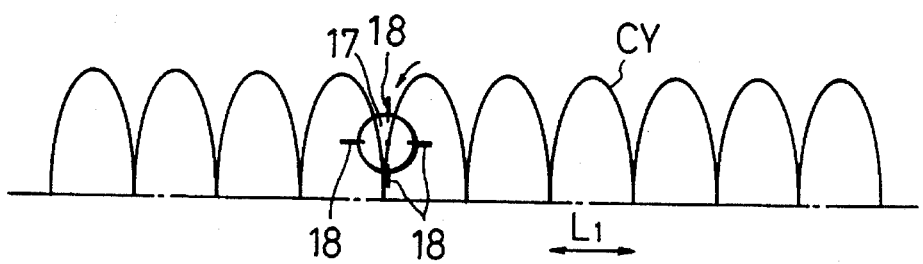
FIG. 7 is a diagram illustrating a locus of cycloidal motions observed when the work head makes a cycloidal motion at a different cycle.
Figure 8:
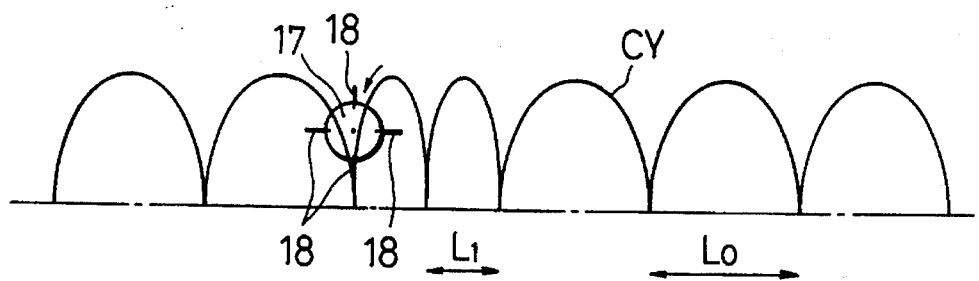
FIG. 8 is a diagram illustrating a combination of the cycloidal motions shown in FIGS. 6 and 7.

If the turning speed of the work head 17 is changed, the cycle of the cycloidal motion of the work nozzle 18 also changes from $L_0$ to $L_1$, for example, as shown in FIG. 7. Further, by continuously changing the turning speed of the work head 17, it is possible to cause the work nozzle 18 to make cycloidal motions having a varying cycle including $L_0$ and $L_1$, as shown in FIG. 8. Thus, the cycle of the cycloidal motion of the work nozzle 18 can be set to a desired value. Consequently, the work nozzle 18 of the work head 17 is able to access a desired work supply position on the worktable 2, as well as the printed board.

In connection with the cycloidal motion of the work nozzle 18, when the work nozzle 18 accesses the work supply position, i.e., the work feeder 6, or the printed board 9, the cycle of the cycloidal motion of the nozzle 18 must be set to $L_0$ such that the speed of the work nozzle 18 relative to the work feeder 6 or the printed board 9 becomes zero.

To control the turning speed of the work head 17, the turning device 19 is provided with a differential gear device called harmonic drive mechanism. The differential gear device is inserted in a power transmission system for transmitting motive power to the aforementioned pivot 25, and controls the turning speed of the pivot 25, i.e., the turning speed of the work head 17.

As is apparent from the above description, the work nozzle 18 of the work head 17 can suck up a work W from a desired work feeder 6 in the supply section of the worktable 2, convey the work W retained thereby to the mounting section, and mount the work W on the printed board in the mounting section. Here, it is to be noted that the position where the work can be mounted to the printed board is restricted to the locus of movement of the work head 17, i.e., the work nozzle 18, encircling the rotary shaft of the head drum 4.

The operation of the work mounting apparatus will be now described with reference to the accompanying drawings.

Referring again to FIG. 1, the head drum 4 is rotated in the direction C at a fixed circumferential speed with respect to the worktable 2, while the work heads 17 are each turned in the direction D at a fixed speed with respect to the head drum 4. A printed board 9 is previously placed on the movable table 10, i.e., the rotary table 22. Thus, the work nozzle 18 of each work head 17 revolves around the rotary shaft of the head drum 4, while repeating a cycloidal motion of a fixed cycle with respect to the worktable 2. In FIG. 1, symbol CY denotes the locus of movement of the work nozzle 18, i.e., the cycloid curve.

When the work nozzle 18 of the work head 17 reaches the lowest position of its cycloidal motion at the work supply section, it is supplied with the suction pressure, whereby the work W at the work supply position of a predetermined work feeder 6 is sucked up by the work nozzle 18. At this point of time, the ground speed of the work nozzle 18 is zero, as mentioned above, and thus the work nozzle 18 can reliably suck up the work.

After the work W is sucked by the work nozzle 18, it is conveyed to the printed board 9 at the mounting section, while repeating the cycloidal motion, together with the work nozzle 18, as the head drum 4 rotates. In the process of this work transportation, the aforementioned controller controls the cycle of the cycloidal motion of the work head 17 in accordance with the point on the printed board 9 at which the work W is to be mounted, i.e., the target point. More specifically, by changing the cycle of the cycloidal motion of the work head 17, the lowest position, or the access position, of the work nozzle 18 for accessing the printed board 9 is positioned with respect to the circumferential direction of the head drum 4, i.e., the locus of revolution of the work head 17. By the time the work W lowers toward the printed board 9, the cycle of the cycloidal motion of the work nozzle 18 is returned to $L_0$, as in the case of sucking up the work W from the work feeder 6, whereby the speed of the work nozzle 18 relative to the printed board becomes zero.

On the other hand, the controller controls the movement of the movable table 10 in accordance with the aforementioned target point; therefore, the target point on the printed board 9 is positioned on the locus of revolution of the work head 17. More specifically, to set the target point, the controller operates the first servomotor 39 to move the slide table 23, and at the same time operates the second servomotor 42 to rotate the rotary table 22.

As described above, the access position of the work nozzle 18 above the printed board 9 is set on the locus of revolution of the work head 17 in accordance with the target point on the printed board, whereas the target point on the printed board is set on the locus of the revolution through movement of the movable table 10, whereby the work W sucked by the work nozzle 18 can be mounted to any desired target point on the printed board 9.

When the rotary table 22 rotates, the work nozzle 18 also rotates on the axis thereof, whereby the orientation of the sucked work is changed. Consequently, the work can be mounted on the printed board, with the orientation thereof directed in a proper direction, regardless of the rotation of the rotary table 22.

The target point at which the work W is mounted on the printed board 9 is determined by a program stored in the controller, according to the kind of work and the mounting order.

When the work W is mounted on the printed board 9, the supply of the suction pressure to the work nozzle 18 is suspended. Preferably, at this time, a blow pressure is supplied to the work nozzle 18 so that the work W retained by the work nozzle 18 can be reliably mounted to the target point on the printed board 9 by means of the blow pressure.

After all necessary works W are mounted on the printed board 9, the printed board 9 is discharged from the movable table 10, i.e., the rotary table 22, to the outlet conveyor 14.

In the work mounting apparatus described above, the work nozzle 18 can be made to access a desired point on the locus of revolution of the work head 17 by controlling the cycle of the cycloidal motion of the work head 17. Accordingly, the work can be mounted to the target point on the printed board, by simply moving the printed board 9 only in a direction to intersect the locus of revolution of the work head 17 by means of the movable table 10, and shifting the target point on the printed board 9 to the locus of the revolution. Further, in this embodiment, the movable table, and thus the printed board, makes a composite movement which is the composition of the linear motion of the slide table 23 and the rotary motion of the rotary table 22; therefore, the printed board 9 can be moved in the direction to intersect the locus of the revolution at very fast speed, and the target point on the printed board can be quickly brought to the locus of the revolution. Regarding the rotary motion of the rotary table 22, in particular, even a slight change in the angle of rotation of the rotary shaft of the rotary table can quickly shift the target point on the printed board 9 by a large margin, even though the target point is distant from the center of rotation in the diametrical direction. Accordingly, the time required to bring the target point on the printed board to the locus of revolution of the work head 17 can be greatly shortened, thus permitting high-speed rotation of the head drum 4. Consequently, the work mounting apparatus is improved in the efficiency of mounting works on printed boards.

This invention is not limited to the above-described embodiment alone, and various modifications may be made.

For example, in the aforementioned table device, the rotary shaft 36 of the rotary table 22 is positioned in the center of the slide table 23. However, the arrangement of the rotary table is not limited to this alone, and the position of the rotary shaft 36 may be at any point on the surface of the slide table 23. Further, although in the above embodiment, the rotary shaft of the rotary table 22 is coupled to the motor shaft of the second servomotor 42 through the first and second gears 38 and 40, the shaft 36 of the rotary table 22 may alternatively be coupled directly to the motor shaft of the second servomotor 42.

Furthermore, the aforesaid rotary table 22 is formed by an endless movable belt. Alternatively, an extra means may be provided in the rotary table 22 itself or adjacent thereto for receiving/discharging printed boards 9 from/to the inlet and outlet conveyors 12 and 14.

Figure 9:
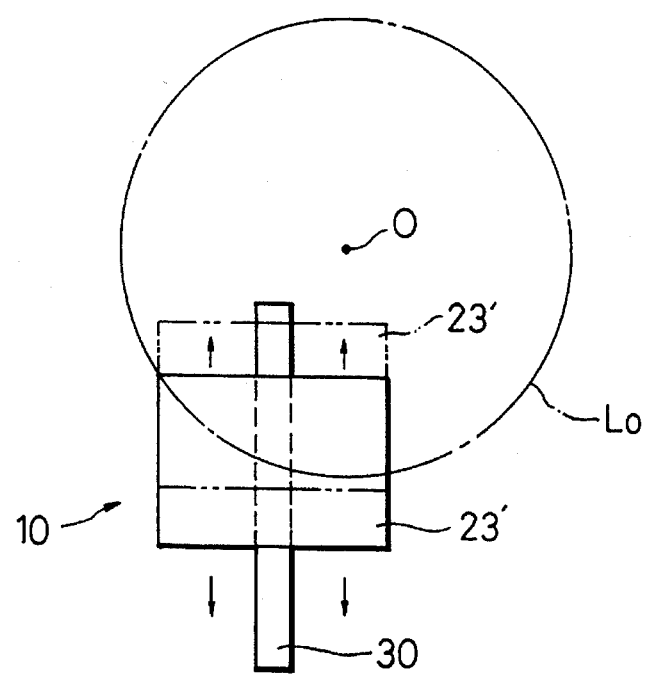
FIG. 9 is a schematic diagram illustrating a modification of a table device.

As shown in FIG. 9, the movable table 10 may include only a slide table 23'. The slide table 23' is movable along a guide rail 30 so as to rectilinearly cross the locus $L_0$ of revolution of the work head 17. In this case, the upper surface of the slide table 23' is formed by an endless movable belt.

Figure 10:
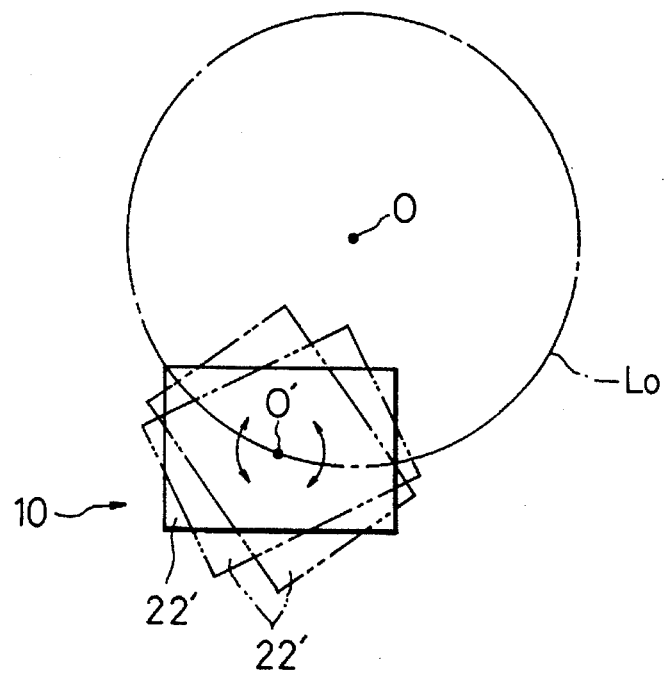
FIG. 10 is a schematic diagram illustrating another modification of the table device.

Alternatively, the movable table 10 may include only a rotary table 22', as shown in FIG. 10. The rotary table 22' has its center of rotation, O', located on the locus $L_0$ of the revolution.

Figure 11:
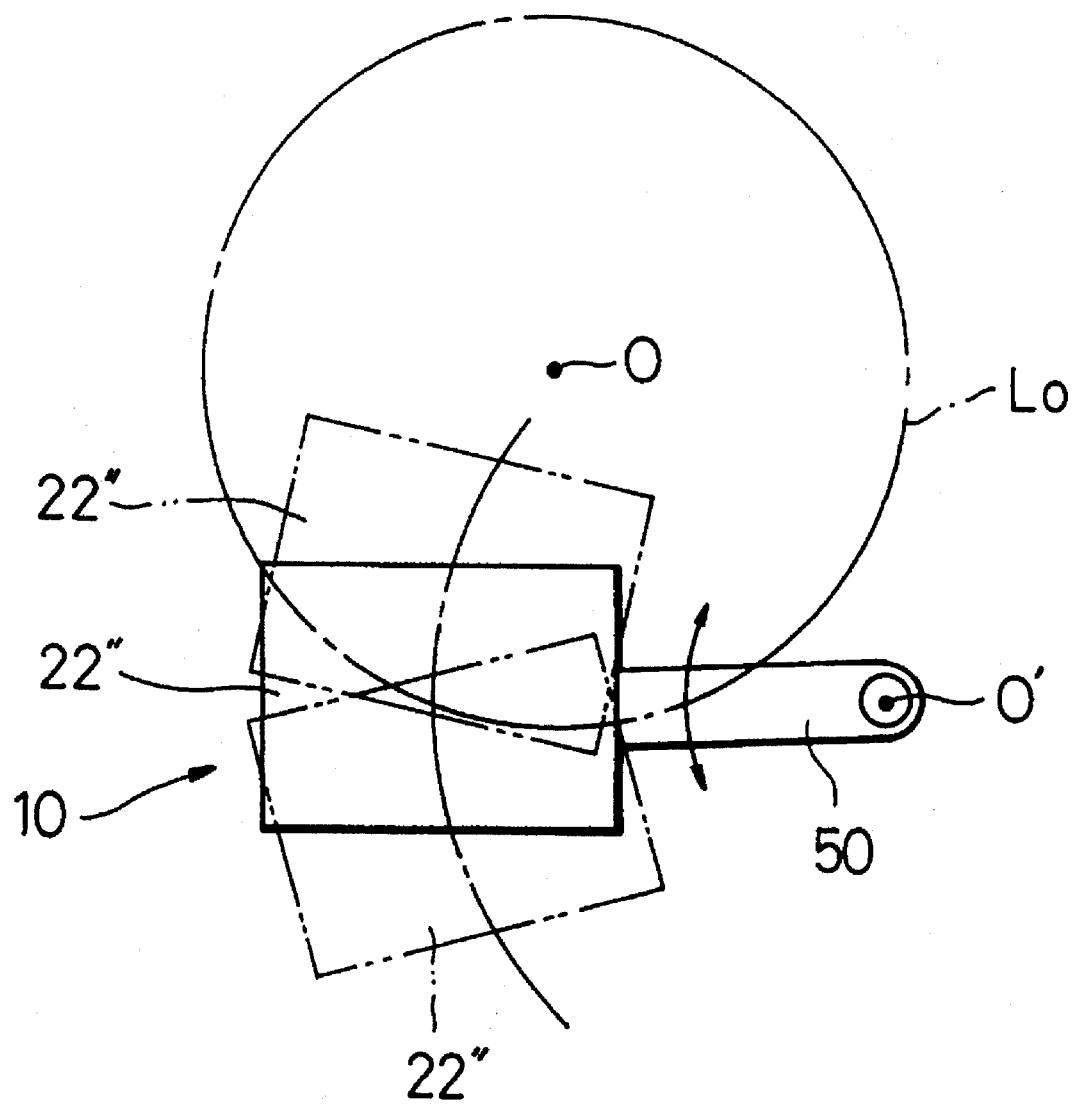
FIG. 11 is a schematic diagram illustrating still another modification of the table device.

Further, as shown in FIG. 11, the movable table may be a swing table 22". The swing table 22" has its center of swinging motion, O', located outside the locus $L_0$ of the revolution, and moves in a circular arc. In this case, the center O' of swinging motion, i.e., the pivot, is coupled to the swing table 22" by an arm 50.

Whichever arrangement is employed, no problem arises so long as the movable table 10 can move such that the printed board on the movable table 10 passes across the locus of revolution of the work head.

What is claimed is:

1. A work mounting apparatus comprising:
   a work supply section having a supply position to which works are continuously supplied, the supply position being located on a predetermined travel path;
   pickup means for picking up a work from the supply position, said pickup means including a carrier arranged above the travel path and movable along the travel path, a work head arranged at the carrier and having an attraction rod projecting toward the travel path, and drive means for causing the work head to make a cycloidal motion, while holding the work head in a fixed orientation with respect to the travel path during movement of the carrier;
   a work mounting section arranged on the travel path at a distance from said supply section, said work mounting section including a table surface for receiving thereon a component on which a work is to be mounted;
   control means for controlling the cycle of the cycloidal motion to allow the attraction rod of the work head to attract a work at the supply position and to position a release point for the attracted work on the travel path, at which the attracted work is to be released; and
   actuating means for moving the table surface along a line intersecting the travel path such that said actuating means shifts a target point on the component, at which the work is to be mounted, to the release point on the travel path.

2. The work mounting apparatus according to claim 1, wherein said attraction rod is rotatable about an axis thereof.

3. The work mounting apparatus according to claim 2, wherein said actuating means includes rotating means for rotating the table surface in a plane parallel to a plane containing the travel path.

4. The work mounting apparatus according to claim 3, wherein said table surface has a center of rotation located on the travel path.

5. The work mounting apparatus according to claim 2, wherein said actuating means includes swing means for swinging the table surface in a plane parallel to a plane containing the travel path.

6. The work mounting apparatus according to claim 5, wherein said swing means has a center of swinging motion for the table surface, the center of swinging motion being located at a predetermined distance from the table surface.

7. The work mounting apparatus according to claim 3, wherein said actuating means further includes reciprocating means for causing a linear motion of the table surface toward the travel path.

8. The work mounting apparatus according to claim 7, wherein said reciprocating means includes a guide rail extending toward the travel path and a slider capable of a reciprocating motion on the guide rail, said rotating means including a rotatable shaft projecting upward from the slider, and said work mounting section further including a table mounted on the rotatable shaft and having an upper surface serving as said table surface.

* * * * *